United States Patent [19]
Lee et al.

[11] Patent Number: 5,371,701
[45] Date of Patent: Dec. 6, 1994

[54] STACKED DELTA CELL CAPACITOR

[75] Inventors: Ruojia Lee; Charles H. Dennison; Yauh-Ching Liu; Pierre Fazan; Steven D. Cummings, all of Boise, Id.

[73] Assignee: Micron Technology, Inc., Boise, Id.

[21] Appl. No.: 223,477

[22] Filed: Apr. 5, 1994

Related U.S. Application Data

[60] Division of Ser. No. 76,300, Jun. 11, 1993, Pat. No. 5,321,649, which is a continuation-in-part of Ser. No. 592,109, Oct. 3, 1990, abandoned.

[51] Int. Cl.⁵ ............................................. H01L 29/68
[52] U.S. Cl. .................................. 365/149; 257/306; 257/309
[58] Field of Search ................ 365/149; 257/307, 308, 257/306, 309; 437/48, 52

[56] References Cited

U.S. PATENT DOCUMENTS

| | | | |
|---|---|---|---|
| 5,130,885 | 7/1992 | Fazan et al. | 257/309 |
| 5,285,092 | 2/1994 | Yoneda | 257/307 |

*Primary Examiner*—Eugene R. LaRoche
*Assistant Examiner*—Vu Le
*Attorney, Agent, or Firm*—David J. Paul

[57] ABSTRACT

A stacked delta cell (SDC) capacitor using a modified stacked capacitor storage cell fabrication process. The SDC is made up of polysilicon structure, having an inverted deltoid cross section, located at a buried contact and extending to an adjacent storage node overlaid by polysilicon with a dielectric sandwiched in between. The addition of the polysilicon structure increases storage capability 120% without enlarging the surface area defined for a normal stacked capacitor cell.

9 Claims, 12 Drawing Sheets

STACKED DELTA CELL CAPACITOR

CROSS-REFERENCE TO RELATED APPLICATION

This is a divisional to U.S. patent application Ser. No. 08/076,300 filed Jun. 11, 1993, now having U.S. Pat. No. 5,321,649, which is a continuation-in-part to U.S. patent application Ser. No. 07/592,109 filed Oct. 3, 1990, now abandoned.

FIELD OF THE INVENTION

This invention relates to semiconductor circuit memory storage devices and more particularly to the design of three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, planarized layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown between poly layers in the STC capacitor becomes a major concern once insulator thickness is appropriately scaled.

A paper submitted by T. Ema et al., entitled "3-DIMENSIONAL STACKED CAPACITOR CELL FOR 16M AND 64M DRAMS," IEDM, Dig. Tech. Papers, pp. 592-595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the fins with polysilicon (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins and cell plate is much larger than minimum feature size. The process flow, needed to realize this fin structure, requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue et al., entitled "A SPREAD STACKED CAPACITOR (SSC) CELL FOR 64MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a three-dimensional stacked capacitor cell by using self aligned contacts without additional photolithography steps.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked delta cell (SDC) capacitor defined as a storage cell.

After a silicon wafer is prepared using conventional process steps, the present invention develops the SDC by creating an inverted, delta-shaped poly structure conforming to the topology formed by three adjacent word lines running perpendicular to two adjacent digit lines, which results in increased capacitor plate surface area for each storage cell. Such a structure has the potential to more than double the capacitance of a conventional STC cell.

The present invention is realized in a process for fabricating a DRAM array on a silicon substrate, the process comprising the steps of:

creating a plurality of separately isolated active areas arranged in parallel rows and parallel columns;

creating a gate dielectric layer on top of each active area;

forming a first conductive layer superjacent to surface of the array;

forming a first dielectric layer superjacent to the first conductive layer;

patterning the first conductive and the first dielectric layers to form a plurality of parallel conductive word lines aligned along the rows such that each word line passes over a inner portion of each active area being separated therefrom by a remnant of the gate dielectric layer;

creating a conductively-doped digit line junction and storage node junction within each active area on opposite sides of each word line;

forming a second dielectric layer superjacent to the array surface;

creating a first aligned buried contact location at each digit line junction in each active area;

forming a second conductive layer superjacent to the array surface, the second conductive layer making direct contact to the digit line junctions at the first buried contact locations;

forming a third dielectric layer superjacent to the second conductive layer;

patterning the second conductive layer and the third dielectric layer to form a plurality of parallel conductive digit lines aligned along the columns such that a digit line makes electrical contact at each digit line junction within a column;

forming a first oxide layer superjacent to the exiting material on the array surface;

creating a second aligned buried contact location at each storage node junction in each active area;

forming a third conductive layer superjacent to the material on the array surface assuming, the third conductive layer forming a plurality of peaks and valleys and making contact to the storage node junctions at the second buried contact locations;

forming a second oxide layer superjacent to the third conductive layer;

planarizing the array surface down to the third conductive layer which exposes the peaks of the third conductive layer;

forming a fourth conductive layer superjacent to the array surface, the fourth conductive layer making direct contact to the peaks of the third conductive layer;

patterning the third and fourth conductive layers to form a storage node plate at each storage node junction, the storage node plate having a double, hollow, inverted-deltoid cross-section;

removing the second oxide;

forming a cell dielectric layer adjacent to and coextensive with the storage node plate and adjacent to the array surface; and forming a fifth conductive layer adjacent to and coextensive with the cell dielectric layer to form a cell plate common to the entire memory array.

The invention will allow the maintenance of adjacent capacitance within a DRAM cell as geometries are dramatically shrunk.

BRIEF DESCRIPTION OF THE DRAWINGS

FIG. 3b is a cross-sectional view of the in-process wafer through broken line 3—3 of FIG. 1 at a process stage contemporaneous to the process stage of FIG. 3a;

DETAILED DESCRIPTION OF THE PREFERRED EMBODIMENT

The invention is directed to maximizing storage cell surface area in a high density/high volume DRAM fabrication process, in a sequence shown in FIGS. 1–9c.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and preferably arranged in interdigitated columns and non-interdigitated rows. The active areas are used to form active MOS transistors that can be doped as NMOS or PMOS type FETs depending on the desired use.

Figure 1:
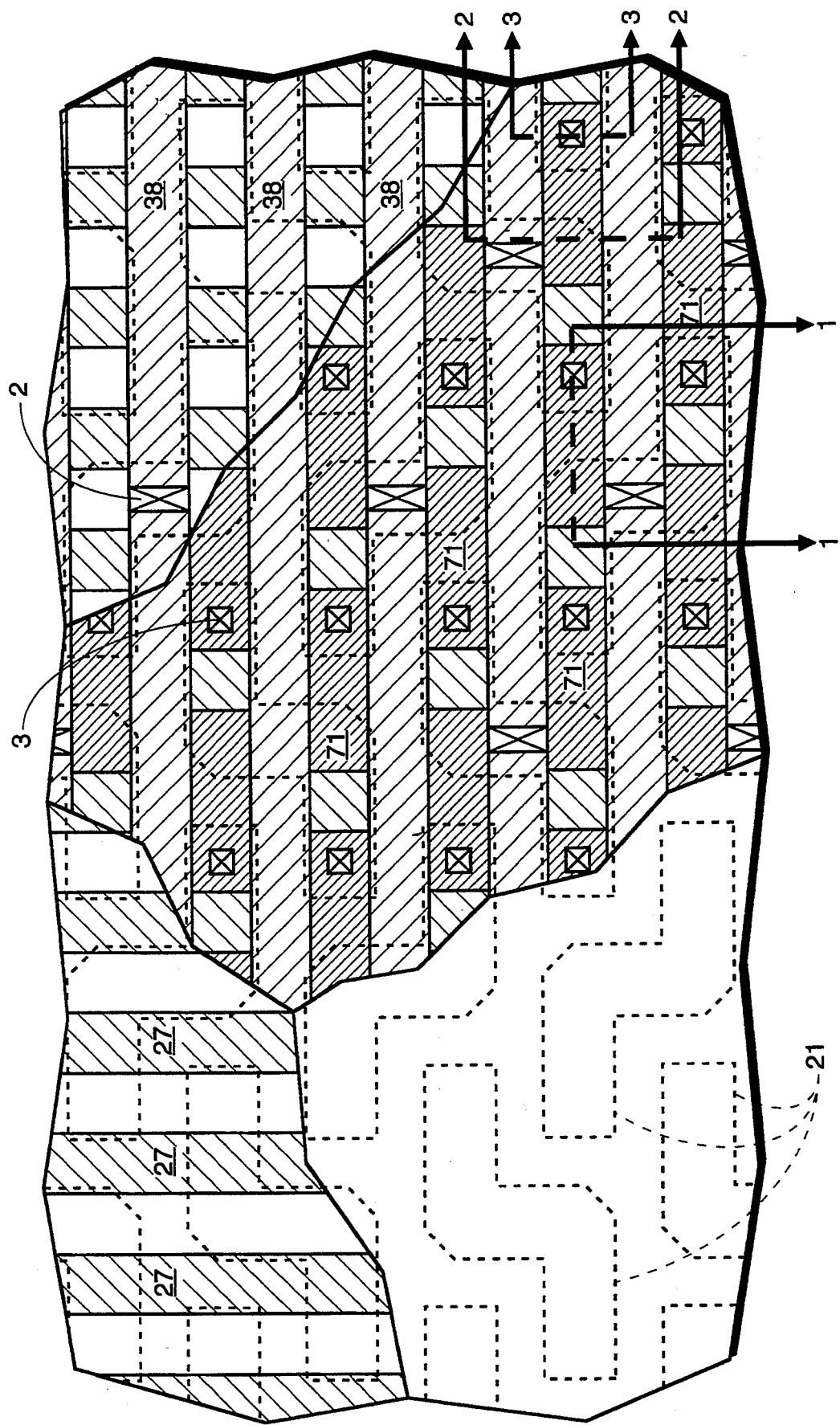
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines 38, word lines 27, active areas 21, and the SDC storage node plate 71. Active areas 21 have been implanted in such a manner as to have each adjacent active area forming a Z-shape and interweaving with one another in the row direction (defined by parallel word lines 27) thereby forming parallel interdigitated rows of active areas 21. In the column direction (defined by parallel digit lines 38) each adjacent active area 21 run end to end thereby forming parallel non-interdigitated columns of active areas 21. Within each active area is a digit line junction 2 and at least one storage node junction 3. In the preferred embodiment and as shown in FIG. 1, there are two storage node junctions within each active area 21, wherein a storage node junction is found at each end of the Z-shaped active areas 21. The stacked capacitor structure of the preferred embodiment (the SDC) is self-aligned to and runs over the top of word lines 27, as well as to digit lines 38.

Figure 2:
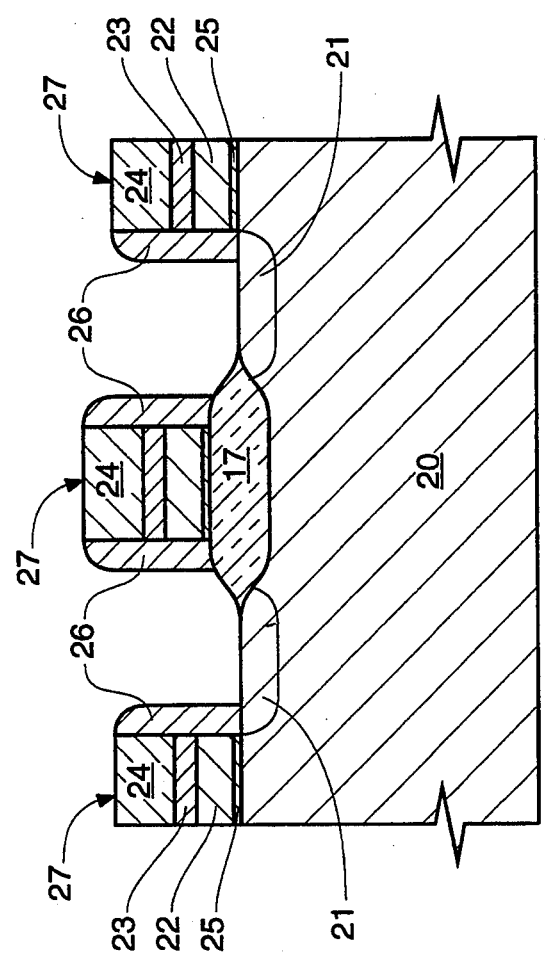
FIG. 2 is a cross-sectional view through broken line 1—1 of FIG. 1.

As shown in FIG. 2, parallel word lines 27, comprising poly lines 22 covered with silicide 23 and nitride 24 and further isolated from subsequent conductive layers by oxide spacers 26, have been previously deposited over a thin layer of gate oxide 25 or a thick layer of field oxide 17. To each side of word lines 27, active areas 21 have been appropriately doped to a desired conductivity type which penetrates into the bulk silicon wafer 20, by conventional process steps. Word lines 27 form the gates to active MOS transistors by bridging between the active areas 21 to form an channel region underneath.

Now the wafer is ready for digit line formation whereby digit lines 38 will run perpendicular to and over the top of word lines 27.

Figure 3B:
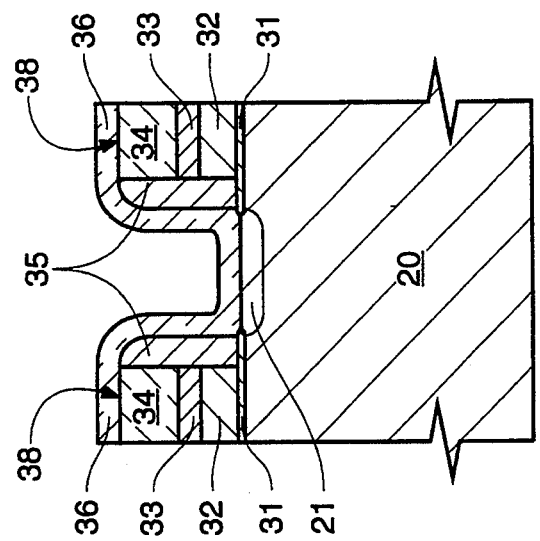
Figure 3A:
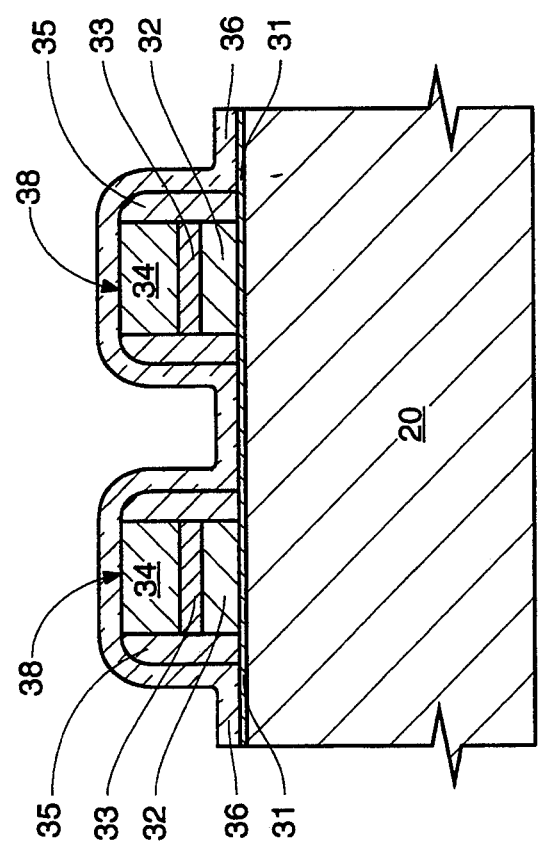
FIG. 3a is a cross-sectional view of the in-process wafer through broken line 2—2 of FIG. 1 following a blanket deposition of conformal oxide.

As shown in FIGS. 3a and 3b, an oxide layer 31 is deposited over the entire wafer array surface followed by a blanket deposition of polysilicon 32, silicide 33 and nitride 34, respectively. Nitride 34 is deposited by chemical vapor deposition (CVD) which is preferred for its excellent conformity. The layers of polysilicon 32, silicide 33 and nitride 34 are patterned and etched with polysilicon 32, previously being conductively doped, in conjunction with silicide 33 to serve as parallel digit lines 38 that are further covered with dielectric layer of nitride 34. Digit lines 38 make contact to active areas 21 at digit line junctions 2 (shown in overhead view FIG. 1), run perpendicular to word lines 27 and conform to the wafer surface resulting in a waveform-like topology running in both the digit line and word line direction.

Up to this point, process flow has followed that of an array comprising conventional stacked capacitor cells. From this point forward, the process is unique to an array having SDC-type storage capacitors. A layer of nitride is now deposited, followed by an anisotropic etch to form nitride spacers 35. Digit lines 38 and their subsequent isolation layers are then covered with oxide 36 to a preferred thickness of 1200 to 1500 angstroms by oxide deposition.

Figure 4B:
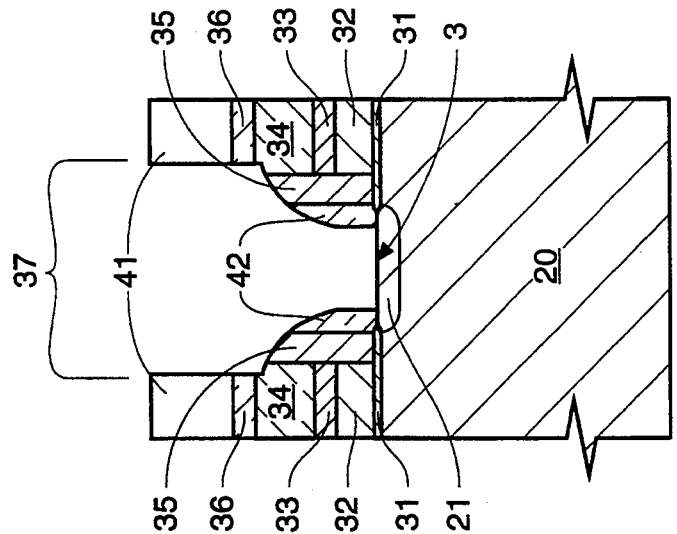
FIGS. 4a and 4b are cross-sectional views of the in-process wafer portion of FIGS. 3a and 3b, respectively, following a buried contact photo and etch.
Figure 4A:
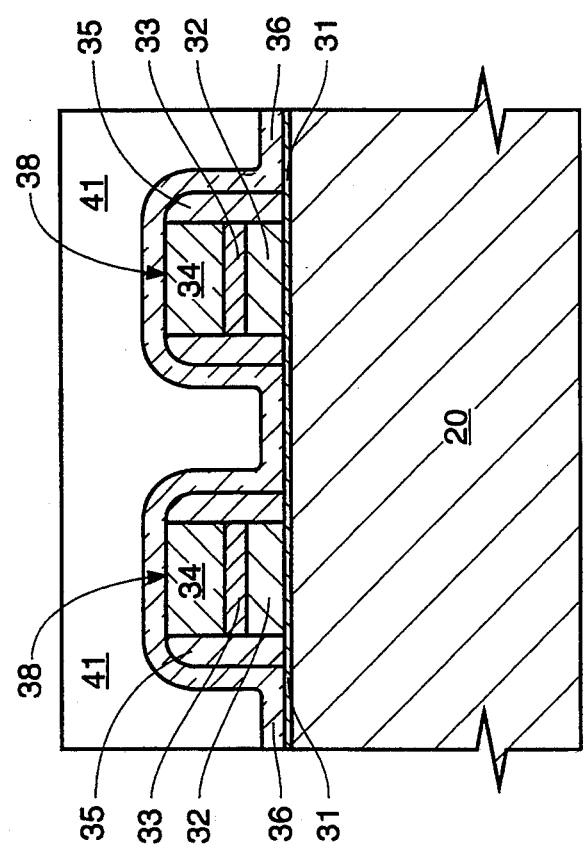

As shown in FIGS. 4a and 4b, a buried contact opening 37, self-aligned to digit lines 38 (by the presence of spacers 35), is located by covering all areas other than contact opening 37 with photoresist 41. After applying an appropriate photomask, a buried contact anisotropic etch on the exposed oxide creates additional oxide spacers 42, provides opening 37 and exposes storage node junction 3.

Figure 5B:
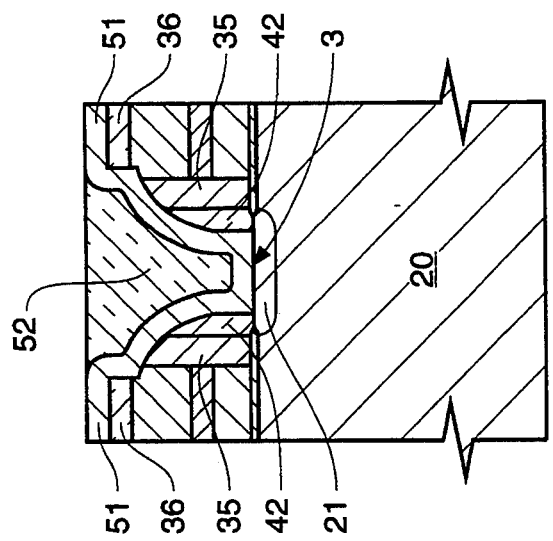
FIGS. 5a and 5b are cross-sectional views of the in-process wafer of portion of FIGS. 4a and 4b, respectively, following a photoresist strip, blanket depositions of conformal poly and oxide and planarization.
Figure 5A:
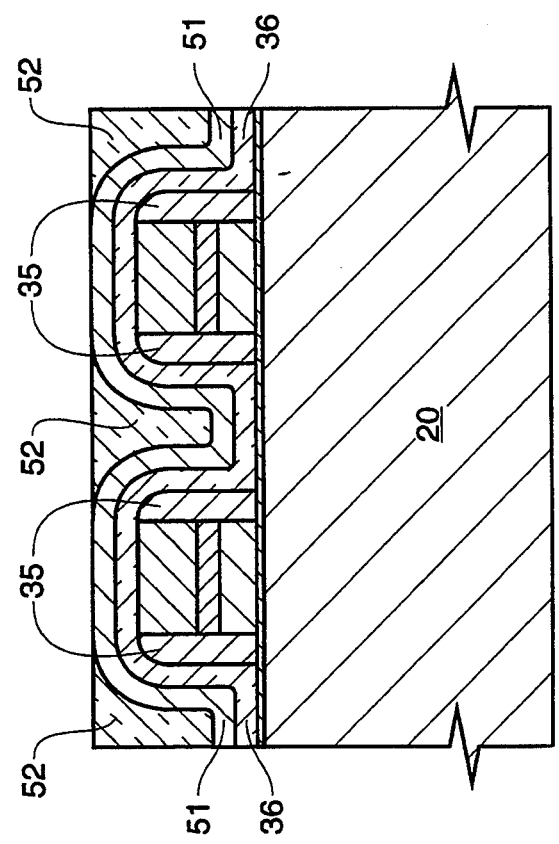

As shown in FIGS. 5a and 5b, the photoresist has been stripped and a conformal poly layer 51 is deposited (preferably by low temperature deposition) over the entire array surface and couples to active area 21 via buried contact 37. The low temperature deposition causes poly layer 51 to have a rugged textured surface that increases poly layer 51 surface area. Poly layer 51 is conductively doped to serve as a portion of bottom plate 51 of the SDC storage capacitor. Plate 51 extends over an adjacent poly word line (the word line is not shown as it runs parallel to cross-sectional views of FIGS. 5a and 5b) and continues to the next adjacent word line. Plate 51 conforms to the perpendicular waveform-like topology (created after digit line formation) which runs in both the word lines and the digit lines direction. Oxide 52 is then deposited (CVD is preferred) and the surface is planarized using a method such as chemical-mechanical planarization (CMP).

Figure 6B:
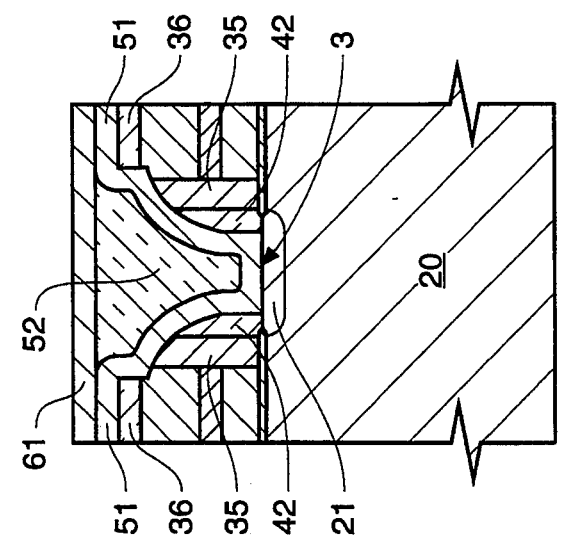
FIGS. 6a and 6b are cross-sectional views of the in-process wafer of portion of FIGS. 5a and 5b, respectively, following a blanket deposition of conformal poly.
Figure 6A:
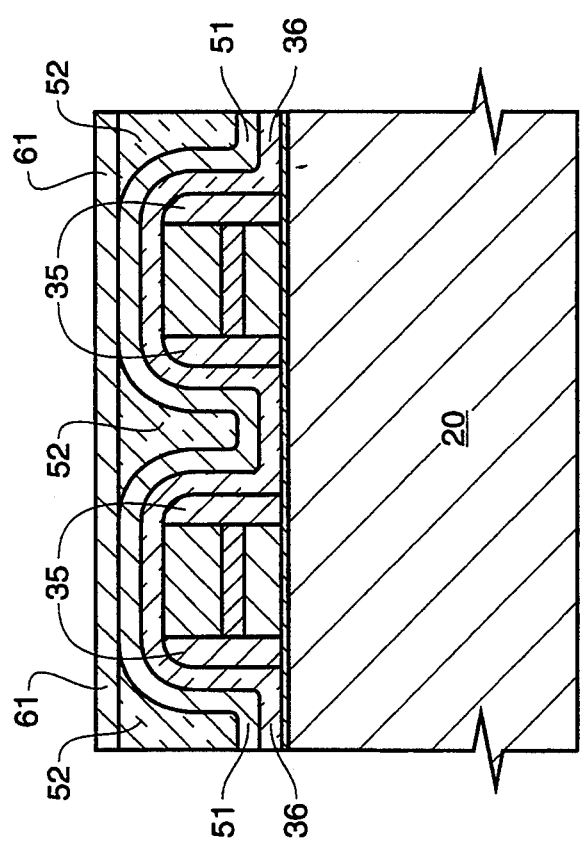
Figure 7B:
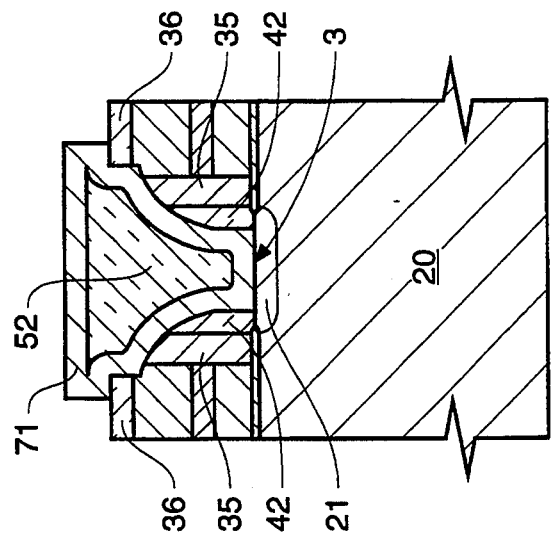
FIGS. 7a and 7b are cross-sectional views of the in-process wafer of portion of FIGS. 6a and 6b, respectively, following a patterning and etching of poly.
Figure 7A:
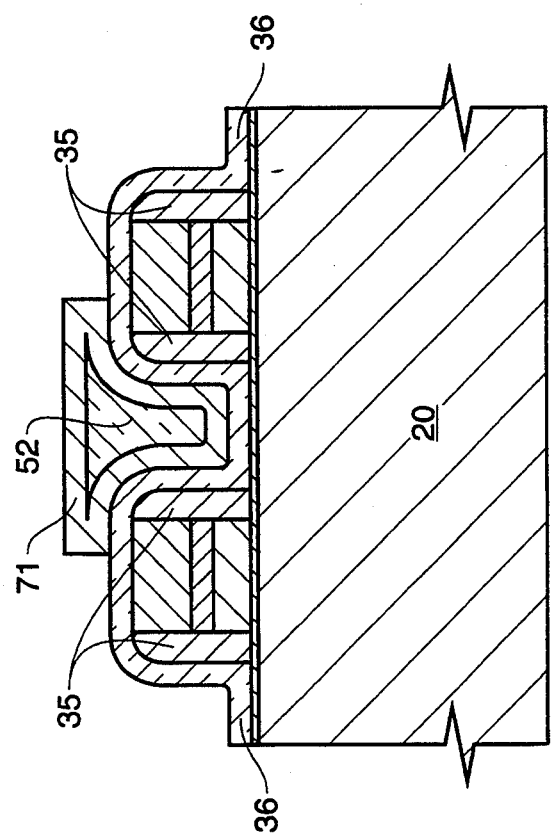

As shown in FIGS. 6a and 6b, poly 61 is deposited over plate 51 and oxide 52. Poly 61 is also preferably deposited by low temperature deposition to form a rugged textured poly surface. Due to the previous planarization of the wafer, combined with the waveform-like topology of plate 51, poly 61 makes contact at only the peaks of the waveform-like shape of plate 51. After poly deposition, poly 61 is masked and etched and conductively doped to combine with plate 51 to form a completed poly storage node plate 71 having patterned edges such that the completed storage node plate 71 has a rectangular shape when looking at the overhead view of FIG. 1. These patterned edges expose the underlying oxide 52 at the outer most ends of the rectangular shape as well as at the sides where poly 61 is conforming to a valley (or low spot) in the topography and where poly 71 is conforming to a peak (or high spot) in the topography. Preferably, storage node plate 71 has a rugged, textured poly surface, comprising a first and second inverted deltoid cross section, as shown in FIGS. 7a and 7b, respectively. Due to etching, the inside corners of the deltoid, its deltoid shape will become somewhat rounded. In addition, the structure is an inverted double deltoid, an apex is created at a center, lower-most point of each inverted deltoid. The apex of the first deltoid shape makes electrical contact with a cell storage node junction 3 (as shown in FIG. 7a), already created earlier in the process, and the outward surface of a second apex is isolated from an adjacent active area by oxide 36 that was previously deposited. The apex of the second inverted deltoid is isolated from the underlying substrate 20 by the presence of oxide 36, as shown in FIG. 7b.

Figure 7C:
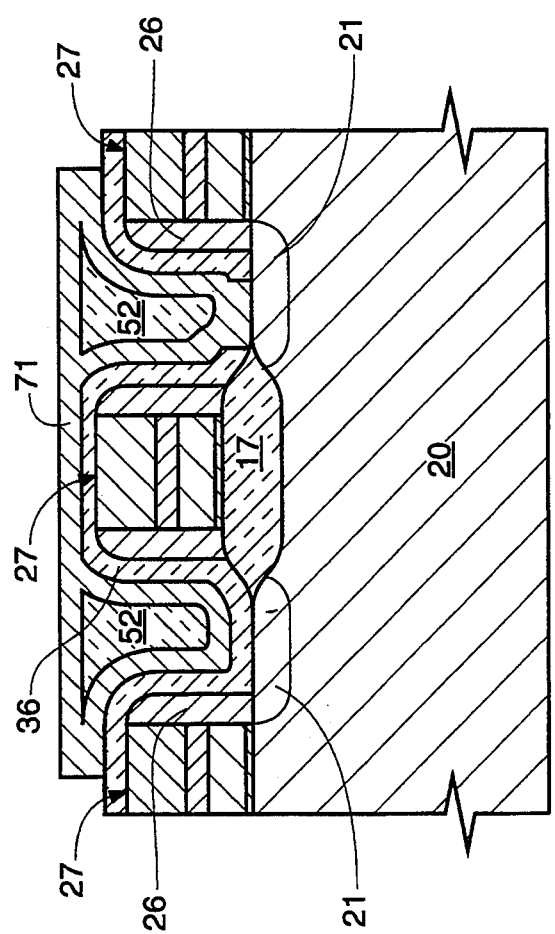
FIG. 7c is a word line cross-sectional view of the in-process wafer of portion of FIGS. 7a and 7b.

FIG. 7c shows the two deltoids connected as they would appear when taking a cross-sectional view of the word lines 27. The first and second deltoid portions are interconnected by poly 71 to form one storage node plate that will be further discussed hereinafter.

Figure 8B:
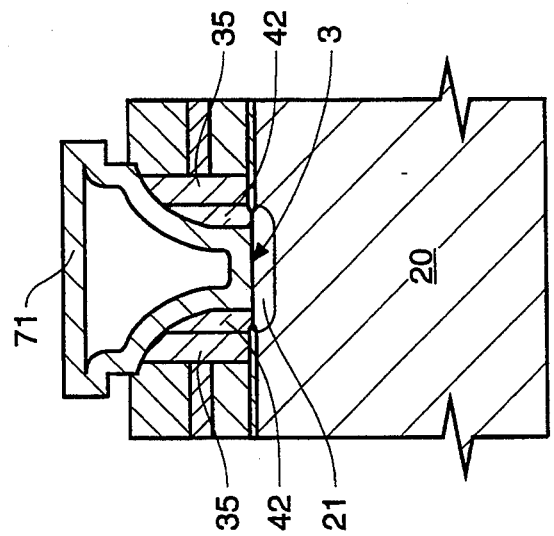
FIGS. 8a, 8b and 8c are cross-sectional views of the in-process wafer of portion of FIGS. 7a, 7b and 7c respectively, following a wet oxide etch.
Figure 8A:
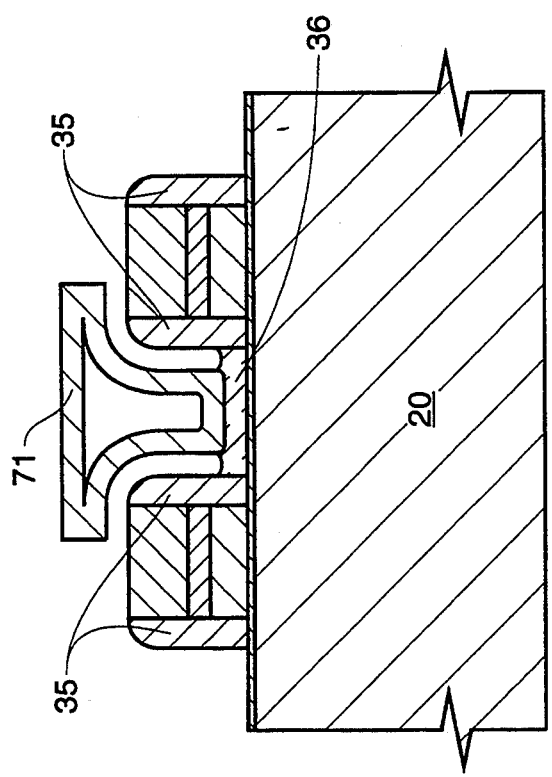
Figure 8C:
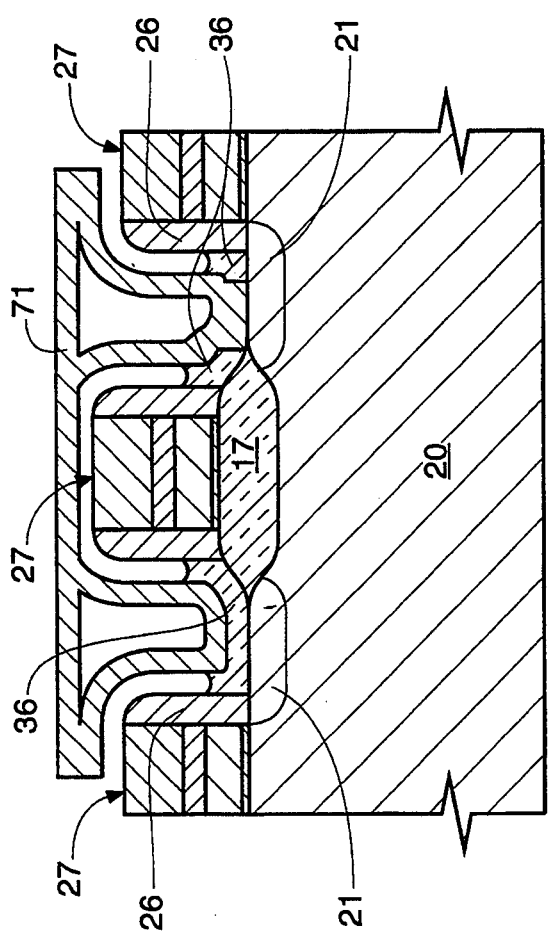

As shown in FIGS. 8a and 8b, a wet oxide etch removes all but a portion of oxide 36 that is underlying the apex of the second deltoid structure and all of the underlying oxide 52 due to the anisotropic etching nature of an oxide wet etch. This wet oxide etch step is in preparation for an isolation layer used as a capacitor dielectric that is deposited next. (FIG. 8c shows the resulting structure seen in the word line cross-sectional view).

Figure 9B:
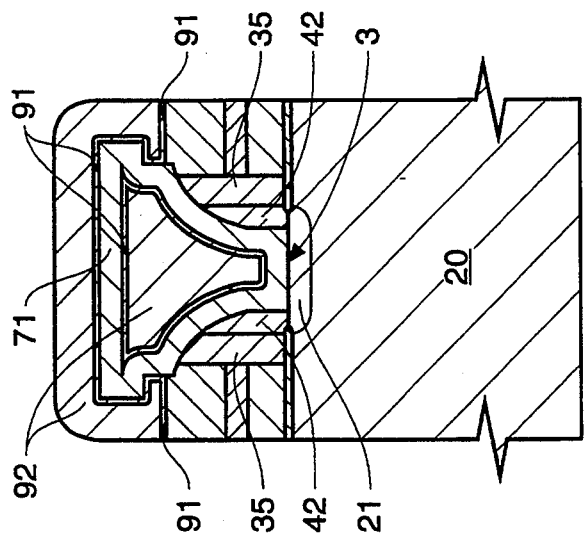
FIGS. 9a, 9b and 9c are cross-sectional views of the in-process wafer of portion of FIGS. 8a, 8b, and 8c respectively, following blanket depositions of conformal nitride and poly.
Figure 9A:
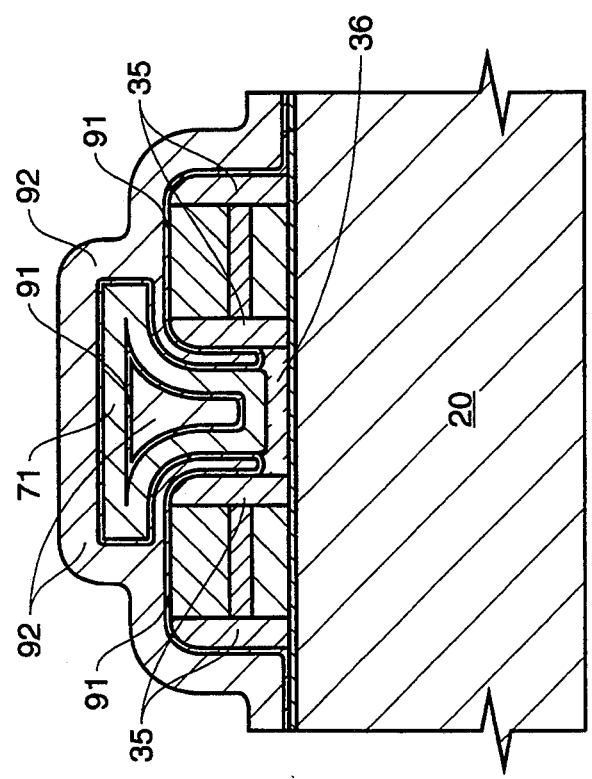
Figure 9C:
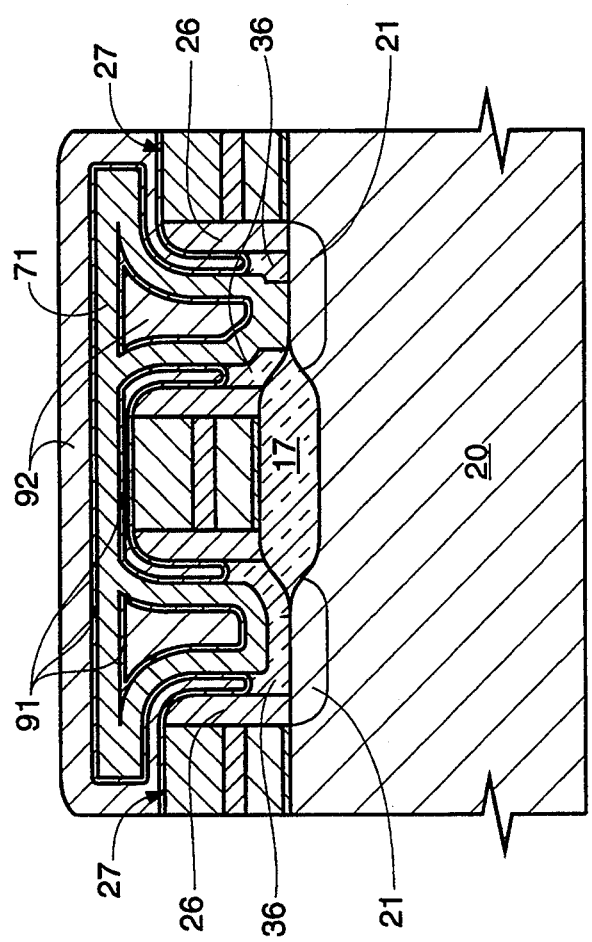

As shown in FIGS. 9a and 9b, a dielectric layer of nitride 91 is deposited that conforms to both the inside and outside surfaces of plate 71. Following nitride 91 deposition, a blanket deposition of conformal poly is preformed that not only covers the array surface but also fills the hollow voids created earlier in plate 71. The poly is conductively doped to serve as a top poly capacitor cell plate 92 of the SDC storage capacitor which also becomes a common cell plate to all SDC storage capacitors in the array. (FIG. 9c shows the resulting structure seen in the word line cross-sectional view.)

The patterned edges of the storage node plate allow for access to the inside surface of the deltoid structures and therefore, no access or via holes are necessary for the subsequent removal of oxide 52, nor for the deposition of a cell dielectric inside the hollow deltoid structures nor for the deposition of the cell plate poly 92 inside the hollow deltoid structures.

With the addition of poly plate 71 as the storage node plate along with a top capacitor cell plate that surrounds and extends through plate 71, substantial capacitor plate surface area is gained at the storage node. Since capacitance is mainly effected by the surface area of a capacitor's ceil plates the additional area gained by a 3-dimensional SDC structure can provide more than double the capacitance of a conventional STC capacitor, without more space than that required for defining a stacked capacitor storage cell.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A stacked capacitor fabricated in a semiconductor device, said stacked capacitor comprising:
   a first conductive layer, said first conductive layer forming first and second inverted deltoid components, each of which having a downward apex and upward peaks, said first conductive layer making contact to a diffusion junction at said first inverted deltoid apex, said second inverted deltoid apex being isolated from an adjacent diffusion junction by an isolating layer;
   a second conductive layer having top and bottom surfaces planarly spanning said first conductive layer, said bottom surface of said second conductive layer making contact to said peaks of said first conductive layer forming a hollowness therein, said second conductive layer combining with said first conductive layer thereby forming a first capacitor electrode:
   a capacitor dielectric layer being adjacent said first capacitor electrode and coextensive therewith; and
   a third conductive layer forming a second capacitor electrode, said second capacitor electrode having upper and lower surfaces and being adjacent to said capacitor dielectric layer and coextensive therewith.

2. The stacked capacitor as recited in claim 1, wherein said isolating layer is oxide.

3. The stacked capacitor as recited in claim 1, wherein said first, second and third conductive layers are conductively doped polysilicon.

4. The stacked capacitor as recited in claim 1, wherein said conductively doped polysilicon is p-type.

5. The stacked capacitor as recited in claim 1, wherein said first and said second polysilicon has a rugged, textured surface.

6. A dynamic random access memory (DRAM) having a stacked capacitor fabricated therein, said stacked capacitor comprising:
   a conductively-doped first polysilicon layer, said first polysilicon layer forming first and second inverted deltoid components, each of which having a downward apex and upward peaks, said first polysilicon layer making contact to a diffusion junction at said first inverted deltoid apex, said second inverted deltoid apex being isolated from an adjacent diffusion junction by an isolating layer;
   a conductively-doped second polysilicon layer having top and bottom surfaces planarly spanning said first polysilicon layer, said bottom surface of said second polysilicon layer making contact to said peaks of said first polysilicon layer forming a hollowness therein, said second polysilicon layer combining with said first polysilicon layer thereby forming a first capacitor electrode;
   a capacitor dielectric layer being adjacent said first capacitor electrode and coextensive therewith; and
   a conductively-doped third polysilicon layer forming a second capacitor electrode, said second capacitor electrode having upper and lower surfaces and being adjacent to said capacitor dielectric layer and coextensive therewith.

7. The DRAM capacitor as recited in claim 6, wherein said isolating layer is oxide.

8. The DRAM as recited in claim 6, wherein said conductive-doping is p-type.

9. The DRAM capacitor as recited in claim 6, wherein said first and said second polysilicon has a rugged, textured surface.

* * * * *